United States Patent [19]

Yasuda et al.

[11] Patent Number: 4,929,838

[45] Date of Patent: May 29, 1990

[54] MAGNETIC OBJECT LENS FOR AN ELECTRON BEAM EXPOSURE APPARATUS WHICH PROCESSES A WAFER CARRIED ON A CONTINUOUSLY MOVING STAGE

[75] Inventors: Hiroshi Yasuda, Yokohama, Japan; Masahiko Suzuki, deceased, late of Aichi, Japan, by Yoshikazu Suzuki, Fumie Suzuki, heirs

[73] Assignee: Fujitsu Limited, Kawasaki, Japan

[21] Appl. No.: 310,347

[22] Filed: Feb. 14, 1989

[30] Foreign Application Priority Data

Feb. 16, 1988 [JP] Japan ................. 63-033088

[51] Int. Cl.⁵ .............................. H01J 37/30
[52] U.S. Cl. .................. 250/492.2; 250/396 ML; 250/398
[58] Field of Search ........... 250/396 R, 396 ML, 398, 250/310, 505.1, 492.2, 305

[56] References Cited

U.S. PATENT DOCUMENTS

| | | | |
|---|---|---|---|
| 3,619,607 | 11/1971 | Ichinokawa et al. | 250/396 ML |
| 4,051,381 | 9/1977 | Trotel | 250/398 |
| 4,219,732 | 8/1980 | Nakagawa et al. | 250/396 ML |
| 4,362,942 | 12/1982 | Yasuda | 250/398 |
| 4,376,249 | 3/1983 | Pfeiffer et al. | 250/396 ML |
| 4,544,846 | 10/1985 | Langner et al. | 250/396 ML |
| 4,554,457 | 11/1985 | Kelly | 250/396 ML |
| 4,701,623 | 10/1987 | Beasley | 250/396 R |
| 4,785,176 | 11/1988 | Frosien et al. | 250/396 R |

FOREIGN PATENT DOCUMENTS 57-80645  5/1982  Japan ................ 250/396 ML

OTHER PUBLICATIONS

IEEE Transactions on Electron Devices, vol. ED-22, No. 7, Jul. 1975, "EBES: A Practical Electron Lithographic System", Herriott et al., pp. 385-392.
Microcircuit Engineering, ISBN: 0 12 345750 5, "Computer Analysis of Vail", Pfeiffer et al., pp. 185-194.

Primary Examiner—Jack I. Berman
Attorney, Agent, or Firm—Staas & Halsey

[57] ABSTRACT

An electron beam exposure apparatus scans an electron beam in a limited space for electron beam lithography. A magnetic object lens of the apparatus has a lower pole piece facing an object to be processed, which is placed on a continuously moving stage to be exposed to the electron beam. A bore is opened in the lower pole piece which faces the object, and has a stripe-like cross-section to allow the passage of the electron beam. The shape of the opening inhibits the passage of undesirable leakage magnetic flux issued from the magnetic lens toward the object, and guides the electron beam to land on the object perpendicularly. With this configuration, deflection aberration of the deflection apparatus which is caused by an eddy current induced in the moving stage due to the magnetic flux reaching the stage is substantially prevented, and normal landing of the electron beam on the object is realized.

23 Claims, 6 Drawing Sheets

MAGNETIC OBJECT LENS FOR AN ELECTRON BEAM EXPOSURE APPARATUS WHICH PROCESSES A WAFER CARRIED ON A CONTINUOUSLY MOVING STAGE

BACKGROUND OF THE INVENTION (1) Field of the Invention

The present invention relates to an electron beam exposure apparatus employed for electron beam lithography. Particularly, it relates to a magnetic object lens for the electron beam apparatus, which is improved to reduce eddy current induced in a continuously moving stage carrying an object to be processed and to enable the normal landing o the electron beam on the object.

(2) Description of the Related Art

The use of an electron beam exposure system is well-known as a method for forming minute patterns on large scale integrated circuit semiconductor devices (LSIs). As the integration density and complexity of the LSI increases, conventional optical lithographic techniques encounter a limit to the production of extremely dense LSI circuit patterns. As a result, another form of pattern-making technique with higher accuracy, such as electron beam lithography, is required. The primary advantage of electron beam lithography is its high resolution capability. Problems due to diffraction effects which are inherent to optical lithography, are resolved by electron beam lithography because the equivalent wavelength of electrons in the 10 to 20 kilovolt energy range is less than 1 Å which is substantially smaller than that of an ultraviolet ray. In addition, the pattern-making is precisely controlled by a computer and is performed in short fabrication step flow, which leads to automation of a high volume production system of intricate LSI semiconductor devices. Through automation, high throughput, stable and accurate pattern-making with high yield are achieved.

Electron beam exposure systems include both electron beam projection lithography and scanning electron beam lithography. In scanning electron beam lithography, the pattern is written with a fine electron beam which is controlled by a computer to turn the beam ON and OFF and to control its deflection. The scanning electron beam system is composed of: a beam-forming system in which electrons emitted from an electron source are formed into a fine beam having a round or rectangular cross-section; a beam deflection system in which the beam is deflected in a raster or vector scanning manner, and projected onto an object such as a wafer or a mask plate (hereinafter, for convenience the medium is referred to as a wafer); and a pattern-generation and control system for controlling the scanning of the electron beam and the movement of the medium to form a required pattern on the wafer.

Generally, the scanning distance of the electron beam is limited to be within a short length, such as 2 mm, to avoid undesirable aberration. Accordingly, the entire surface of the wafer is divided into small projection sub-areas to make circuit patterns thereon. The sub-areas are individually exposed to the electron beam in timed sequence. Naturally, the wafer must be moved in synchronization with the scanning of the associated electron beam. The wafer is usually mounted on a horizontal stage which is precisely movable in X and Y directions.

There are two primary ways to move the wafer. The first is a "step and repeat" technique which has been widely used, wherein the individual patterns are formed by deflecting the electron beam over a square field (sub-area) specified on the wafer. After the completion of the pattern-making on this square field, the wafer is stepped to a new location, the electron beam is registered to a sample on the wafer, and then pattern exposure for the next square field is performed.

The second technique for moving the wafer is a "continuously moving stage" technique, which is adopted, for example, in the EBES (electron beam exposure system) developed by the Bell Telephone Laboratories, wherein the electron beam is raster scanned in one direction, and the stage is moved continuously in another direction, usually perpendicular to the scanning direction. Details of this technique are reported in IEEE Transaction on Electron Devices, Vol. RD-22, No. 7, pp. 383-392, July 1975, EBES, "A Practical Electron Lithographic System, by D. R. Heriott et al. The primary advantage of the continuously moving stage technique is that pattern writing and the movement of the wafer can occur at the same time in most cases, and fabrication time can be reduced.

In the "step and repeat" technique, the stepping period of the electron beam to a new location results in wasted time, because the move and stop motion of the stage causes a mechanical vibration of the mechanism associated with the stage due to its inertia. According to the inventors' experience, after the completion of the preceding step movement of the stage, the next patterning operation should be held for 0.3 seconds until the mechanical vibration is favorably reduced to a small amount. Assuming that the wafer is 4 inches in diameter and the square field is 2 mm square in size, then the above-described wasted time totals 520 seconds per wafer. This wasted time occupies approximately 70% of the entire time for patterning the wafer. In view of the throughput of the wafer which is patterned by a scanning electron beam system, therefore, the continuously moving stage system is more favorable for high-volume production of LSIs.

There is another problem in electron beam scanning systems which is caused by an eddy current induced in the moving stage which is subject to a strong magnetic field leaking from the magnetic object lens adjacent to the stage. The problem will be described later in more detail. In relation to this problem, it should be noted that a conventional magnetic object lens always has a circular bore opened in its lower pole piece which faces a wafer to be processed. The bore is indispensable to allow the passage of the scanning electron beam in X and Y directions. The magnetic lens system of electron beam scanning systems has been designed with a rotational axial symmetrical structure in order to eliminate aberration of the magnetic lenses to the extent possible. This appears to be the reason that the circular bore in the magnetic object lens has been adopted in prior art scanning electron beam apparatus.

In general, the primary problem with electron beam scanning systems is aberration of their magnetic lens system, particularly, that of the magnetic object lens. It is desirable that the electron beam always be projected along the axis of the magnetic object lens in order to overcome the aberration problem. Furthermore, it is desirable that the electron beam be projected onto the surface of the wafer perpendicularly, because if the electron beam is incident on the surface obliquely, distortion or discrepancy of a depicted pattern is frequently caused due to unevenness or roughness of the surface of the wafer. This desired projection of an electron beam on the wafer is referred to as a "normal-landing" on the wafer.

To meet the above-described requirements, an improved system of electron beam formation and deflection has been developed and employed in the EL3 system developed by the International Business Machine Corp. (IBM). The magnetic object lens of this system has a variable axis lens (VAL). The technique is disclosed by IBM U.S. Pat. No. 4,376,249, issued Mar. 8, 1983. The VAL is a magnetic lens with an in-lens deflection concept having two deflection coils and two compensating (or lens axis shifting) coils, with all of the coils being provided inside a pole piece of the magnetic object lens. These coils are usually electrically connected in series and enabled simultaneously. The axis of the VAL is shifted in parallel with the original lens axis by enabling the compensating coils to operate in a pair upon the deflection of the beam, so that the deflected electron beam runs in coincidence with the shifted lens axis. Since the electron beam always remains on the axis of the VAL, coma aberration and transverse chromatic aberration are substantially eliminated, and normal landing of the electron beam is realized. However, as described above, a wafer to be treated is placed on a stage movable in X and Y directions. When the stage is made of non-magnetic metal, magnetic flux which emanates from the lowermost compensating coil and lands on the stage by penetrating through the wafer, may cause eddy currents in the stage. The pole piece of the VAL has a circular bore at the bottom portion of the pole piece. Consequently, once the stage is moved, an eddy current is induced in the stage, causing the above-described deflection problem.

In order to eliminate the above-described lowermost compensating coil and prevent the disturbance of the external magnetic field, an improved variable axis magnetic object lens, referred to as variable axis immersion lens (VAIL), has been developed by IBM. This technique is disclosed in U.S. Pat. No. 4,544,846, issued Oct. 1, 1985. The VAIL has a lower pole piece, made of ferrite, which has "zero bore", and a wafer to be irradiated by an electron beam is placed on a stage mounted on the lower pole piece. Since the lower pole piece is made of ferromagnetic material, magnetic flux of the object lens lands on the surface of the lower pole piece. With this configuration, the wafer is immersed in the magnetic field and the electron beam lands on the surface of the wafer perpendicularly through the aid of magnetic flux normal to the lower pole piece. Further, since the lower pole piece has no bore and underlies the wafer, the wafer is surrounded by the structure of the VAIL, so that the structure acts as a magnetic "cage". As a result, the electron beam is shielded from the external magnetic field, and is free from the disturbance caused by the magnetic field. Thus, the electron beam is stable and can have a normal landing with respect to the wafer. However, with the structural configuration of the VAIL, the stage is also immersed in the strong magnetic field of the VAIL. Therefore, when the stage is moved, an eddy current is induced in the stage as described briefly above with respect to the VAL. The VAIL, therefore, is not suitable for continuously moving stage electron beam exposure lithography.

As described above, both the VAL and the VAIL are unsuitable for use with a continuously moving stage because of the eddy current induced in the stage which produces an adverse effect on the electron beam deflection system of the apparatus. The VAL and VAIL lenses are also reported in H.C. Pfeiffer et al., MICROCIRCUIT ENGINEERING ISBN: 0 12 15 345750 5, pps. 7214 81.

In summary, With the beam forming and scanning system of an electron beam exposure apparatus, LSI pattern-making is performed on a wafer which is carried on a continuously moving stage in a predetermined direction. Usually, the scanning direction of the electron beam is perpendicular to the moving direction of the stage. An adverse effect on proper scanning of the electron beam is caused by an eddy current induced in the moving stage which is subject to strong magnetic flux leaked through a circular bore opened in a lower pole piece of the magnetic object lens. The eddy current induces a undesirable magnetic field which deflects the scanning of the electron beam. Therefore, there is a need in the art for an electron beam exposure apparatus which overcomes this problem.

SUMMARY OF THE INVENTION

The primary object of the present invention is to provide an electron beam exposure apparatus capable of forming precise LSI patterns on a wafer which is carried on a continuously moving stage.

Another object of the present invention is to provide an improved magnetic object lens used in a beam forming and scanning system of the electron beam exposure apparatus to eliminate the adverse effect of eddy current induced in the moving stage.

According to the present invention, the adverse effect of an eddy current is eliminated by changing the circular bore of the lower pole piece of a magnetic object lens into a stripe-like opening having a long and narrow mouth and side walls formed in parallel with the axis of the magnetic lens system. The stripe-like opening allows the passage of the scanned electron beam therethrough to be incident on the wafer, while allowing the passage of a substantially small amount of magnetic flux from the lens. Consequently, most of the magnetic flux of the magnetic object lens is confined within the magnetic object lens and is prevented from reaching the continuously moving stage. In addition, most of the magnetic flux passing through the stripe-like opening is in parallel with the axis of the magnetic lens system. As a result, the eddy current induced in the moving stage is substantially eliminated, and electron beam scanning is carried out without substantial deflection error. Further, the magnetic flux which runs through the stripe-like opening in parallel with the axis of the magnetic lens guides the impinging electrons such that the electrons make a substantially normal landing on the surface of the wafer. The normal landing of the electron beam eliminates pattern aberration of images formed on the wafer.

The features and advantages of the present invention will be apparent from the following description and claims with reference to the accompanying drawings, wherein like reference numerals denote like parts throughout.

DESCRIPTION OF THE PREFERRED EMBODIMENT

Except for the magnetic object lens, the structure of the electron beam exposure apparatus of the present invention is well-known and is of the type disclosed in U.S. Pat. No. 4,362,942, entitled "Electron Beam Exposure System and an Apparatus for Carrying Out the Same", issued Dec. 7, 1982 to Yasuda, one of the inventors of the present invention, the content of which is hereby incorporated by reference. In the present invention, the final magnetic object lens of the '942 patent is improved. Hereinafter, the '942 patent is referred to as "the Yasuda patent" for convenience. The electron beam exposure apparatus of the Yasuda patent is used in both the step and repeat system and continuously moving stage system. The use of the apparatus of the present invention is primarily directed to the continuously moving stage system.

Figure 1:
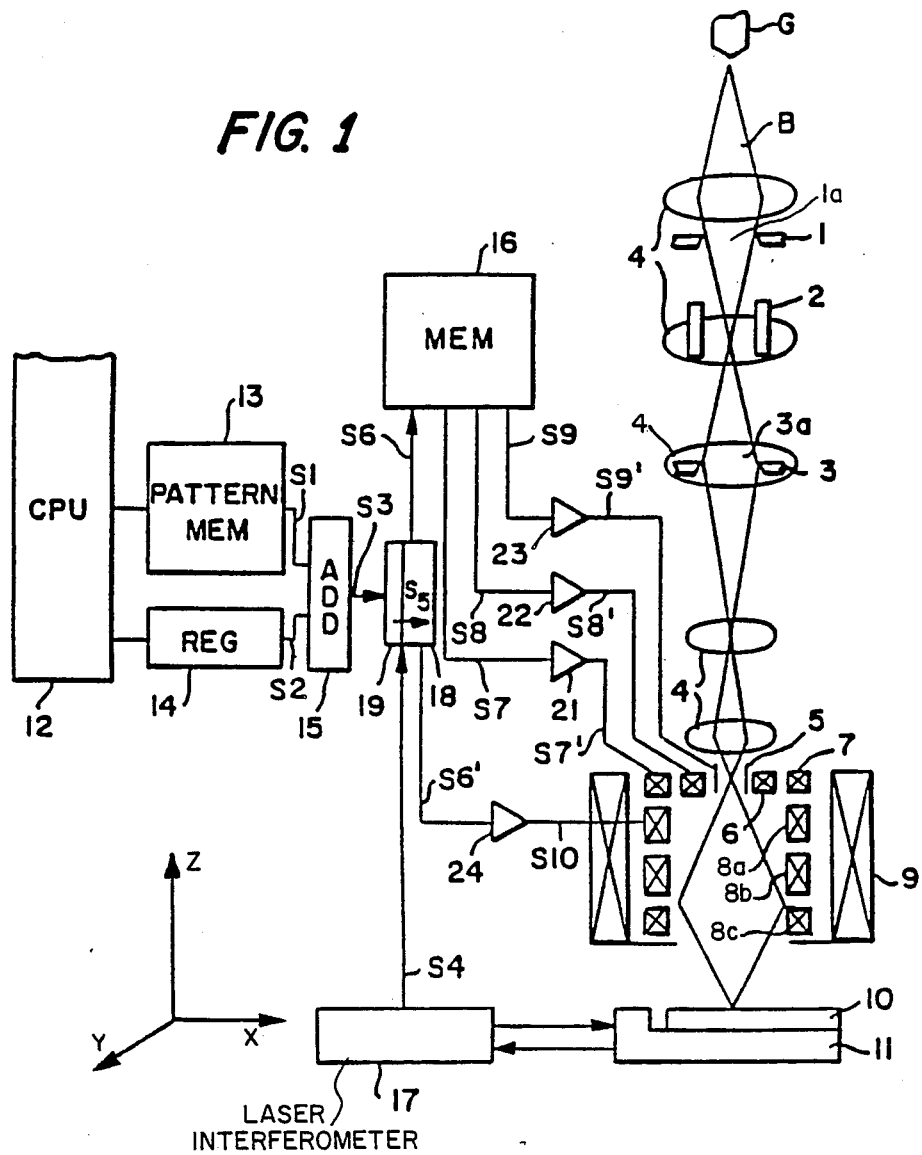
FIG. 1 is a block diagram of an electron beam exposure apparatus in accordance with an embodiment of the present invention.

FIG. 1 is a block diagram of an electron beam exposure apparatus of the present invention. Electrons emitted from an electron gun G are converged and formed into an electron beam B by magnetic lenses 4 and a magnetic object lens 9 symmetrically disposed along an axis which extends in the Z direction. The electron beam B passing through the final magnetic lens, namely the magnetic object lens 9, is projected perpendicularly onto a desired position on a surface of a semiconductor wafer 10 placed on an X and Y direction movable stage 11 which is continuously moving in the X direction. The X, Y, and Z directions are orthogonal with respect to each other.

The electron beam B is turned ON and OFF by a beam blanking device (not shown), and the cross-section of the electron beam B is shaped to have a rectangular section of several types by passing through an aperture 1a of a first slit 1 (a square aperture), being deflected by a deflection plate 2, and passing through an aperture 3a of a second slit 3 (a square aperture), under control of a pattern signal provided from a computer control unit CPU.

The electron beam B thus shaped in response to a pattern signal, is deflected by a deflection system comprising two pairs of deflection coils 8a and 8b and a compensating (axis shift) coil 8c, and is projected onto a center point associated with a small first sub-area, e.g., 100 μ square, which is on the surface of the wafer 10. Thereafter, the electron beam B is deflected by sub-deflection plates 5 to form a pattern composed of a combination of rectangular patterns of several types in the first sub-area. The deflection plates 5 are controlled electrostatically. Reference numerals 6 and 7 denote a stigmator coil and a focus coil, respectively.

After the completion of the pattern formation of the first sub-area, the electron beam B is shifted in the Y direction to be positioned at a center point of the second sub-area, and pattern forming for the second sub-area is conducted subsequently under the control of the CPU 12. In such a manner, by repeating electron beam exposures in each sub-area, the electron beam exposure pattern-making of a series of, for example, 20 sub-areas, arranged in a Y direction, is completed. That is, pattern-making of a small stripe-like area 100 μ wide and 2 mm long extending in the Y direction on the wafer 10, is completed. Thus, the Y direction can be referred to as a main scanning direction. Hereinafter, reference to a scanning direction means the main scanning direction.

Next, the electron beam B is controlled to return back to a new first sub-area located adjacent to the original first sub-area in the X direction. A stripe-like zone on the wafer 10 extending in the X direction and having a width of, for example, 2 mm, is fully exposed to the irradiated electron beam B. Then the electron beam exposure is shifted to the next stripe-like area of 2 mm width. The whole surface area of the wafer 10 is patterned by repeating the above-described operations.

Scanning of the electron beam B in the Y direction is limited within a predetermined span (2 mm in the above example), and within another narrow predetermined span in the X direction (100 μ width for example). Since the scanning of the electron beam B in the X direction is much smaller than that in the Y direction, the entire scanning space in which the electron beam B is scanned is limited to be within a narrow space. In accordance with the present invention, the cross-section of the scanning space perpendicular to the axis of the scanning beam B in the vicinity of the stage 11 has an extremely extended rectangular shape like a stripe. Hereinafter, this scanning space is referred to as a stripe-like scanning space.

The stage 11 is an extremely rugged and precise mechanism, driven in the X and Y directions by a motor (not shown) to provide the wafer 10 placed thereon with a precise and steady movement in response to a pattern signal. The stage is moved in the X direction continuously. The actual location of the field coordinates of the wafer 10 placed on the stage 11 is measured by a laser interferometer 17 (FIG.

Since the stage 11 is always moved in the X direction during electron beam exposure operations, the projection position of the electron beam B should always be corrected to compensate for the movement of the wafer 10, by using the actual location of the wafer 10 which is detected by the laser interferometer 17. The other components of the electron beam exposure apparatus illustrated in FIG. 1, such as the stigmator coil 6, the focus coil 7, memories 13 and 16, a register 14, an adder 15, a converter 18, a subtractor 19, and amplifiers 21 to 24, are described in the Yasuda patent, so that a detailed description thereof is omitted for simplicity.

Figure 2:
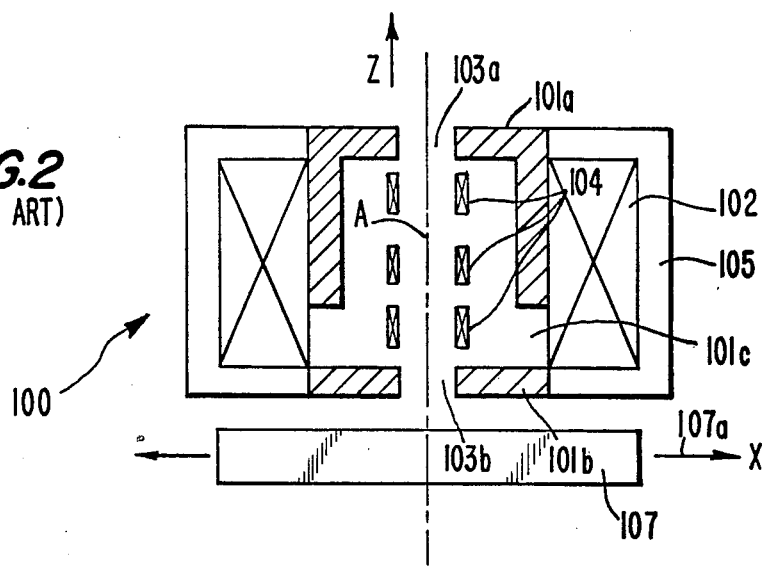
FIG. 2 is a schematic cross-sectional view of a magnetic object lens of a prior art electron beam exposure apparatus, illustrating the structure thereof.

Before describing the present invention in detail, the above-described adverse effect on the deflection of the relevant electron beam caused by the eddy current induced in a moving stage is described in detail. FIG. 2 is a schematic cross-sectional view of a magnetic object lens 100 of a prior art electron beam exposure apparatus. The magnetic object lens 100 is symmetrically structured around an axis A extending in the Z direction, and comprises an upper pole piece 101a, a lower pole piece 101b facing the upper pole piece 101a, and spaced by an air space 101c. A coil 102 generates magnetic flux and surrounds the pole pieces 101a, 101b. An outer shield 105 encloses the coil 102, supports the pole pieces 101a and 101b, and shields the magnetic flux from leaking outside. A stage 107 is movable in the X and Y directions, and deflection coils 104 deflect an electron beam B in the Y direction. It should be noted that the stage 107 includes a complicated and precise mechanism for moving the stage quickly and accurately, but is represented by a simple plate for convenience.

The magnetic flux generated by the coil 102 is guided through the pole pieces 101a and 101b to form a magnetic lens field in the vicinity of the space 101c which exists between the pole pieces 101a and 101b. The magnetic flux generated by the lens 100 is prevented from leaking outside the magnetic lens 100 by the magnetic shield 105, and the magnetic flux generated inside the lens 100 is terminated at the inner wall surfaces of the pole pieces 101a and 101b. Thus, the magnetic flux is basically confined inside the space surrounded by the pole pieces 101a and 101b. However, in the center of the upper surface of the upper pole piece 101a and at the bottom portion of the lower pole piece 101b, there are formed a circular bore 103a and a circular bore 103b, respectively, to allow the passage of the electron beam B therethrough. The magnetic flux which is to be confined inside the magnetic object lens 100 leaks from the bore 103b and intersects the stage 107.

Although the stage 107 is made of insulative material, such as a ceramic plated by a metal layer, to avoid electrical charging thereof, still some quantity of eddy current is induced in the plated metal layer of the stage 107, and the above-described problem caused by the eddy current occurs. In addition, a mechanism made of magnetic material which is disposed under the ceramic stage 107 and which is indispensable for moving the stage in the X and Y directions also may cause a similar problem.

Figure 3:
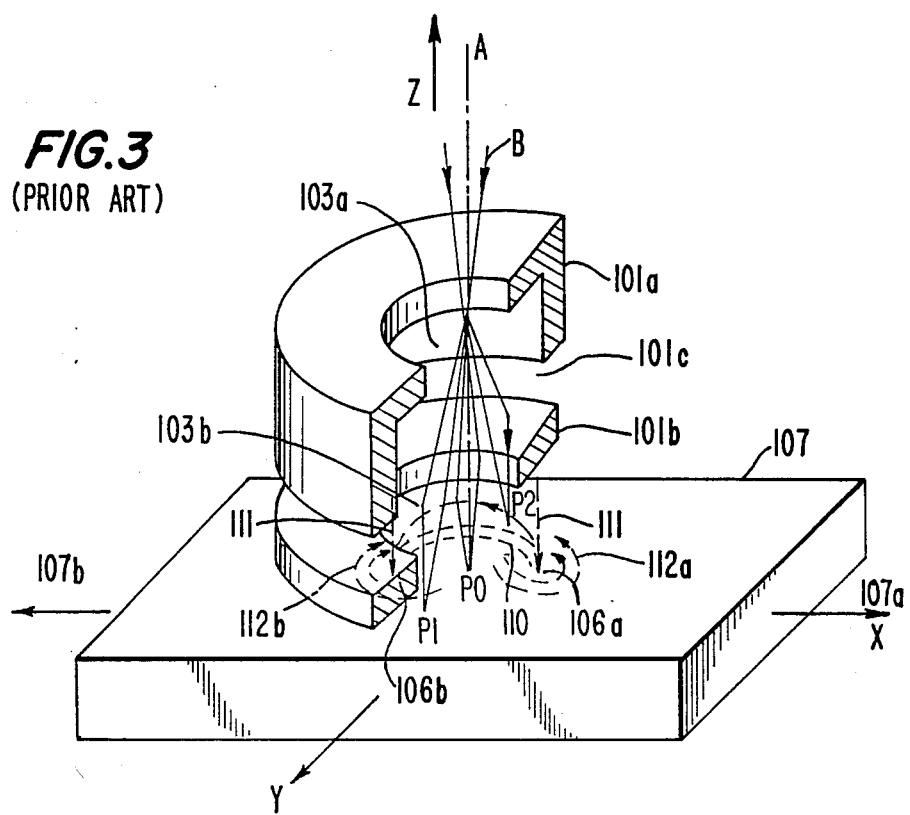
FIG. 3 is a partially broken away perspective view of the magnetic object lens of FIG. 2, illustrating the relationship between a scanned electron beam and an eddy current induced in a stage.

FIG. 3 is a partially broken perspective view of the prior art magnetic object lens of FIG. 2, wherein only the stage 107 and pole pieces 101a and 101b are shown. The electron beam B is focused and projected onto a wafer (not shown) at a neutral point P0 without scanning, and is scanned from point P1 to point P2 by a deflection system (not shown). As shown in FIG. 3, some leakage flux 111 (shown by dotted lines) emanates from the circular bore 103b and intersects the stage 107. The circular shape of the bore 103b appears to have been adopted to make the magnetic-lens system rotationally symmetrical about the axis A to reduce aberration of the magnetic lens system, and to allow the scanning of the electron beam B (shown by solid lines) in both X and Y directions.

When the stage 107 or a portion thereof is made of electrically conductive material and moves in the X direction as indicated by an arrow 107a, there appears a portion 106a on the stage 107 where density of the crossing leakage magnetic flux decreases, and simultaneously a portion 106b where the density increases in line with the movement of the stage 107. These local changes in the magnetic flux density cause eddy currents 112a and 112b (designated by dot-line arrows) at the portions 106a and 106b, respectively. Since the directions of the eddy currents 112a and 112b are opposite to each other, a newly induced magnetic flux 110 (designated by dotted lines) runs from the portion 106a to the portion 106b, crossing the path of the electron beam B which is projecting on the wafer (not shown) to be processed on the stage 107. As a result, the electron beam B is deflected in the Y direction, namely in a direction perpendicular to the moving direction X of the stage 107. Strictly speaking, the deviation of the electron beam B is not always in the Y direction, but occurs in the X direction to some negligibly small degree, depending on the structure and material of the stage 107 and its associated mechanisms, the magnetic field of the magnetic lens, and the energy intensity of the electron beam B. Ultimately, the deflection of the electron beam B in the Y direction is adversely effected, resulting in undesirable distortion of patterns formed on the wafer. The present invention is directed to reducing the eddy current in the stage 107 as much as possible, to eliminate the above-described unwanted deflection of the electron beam B.

Figure 4:
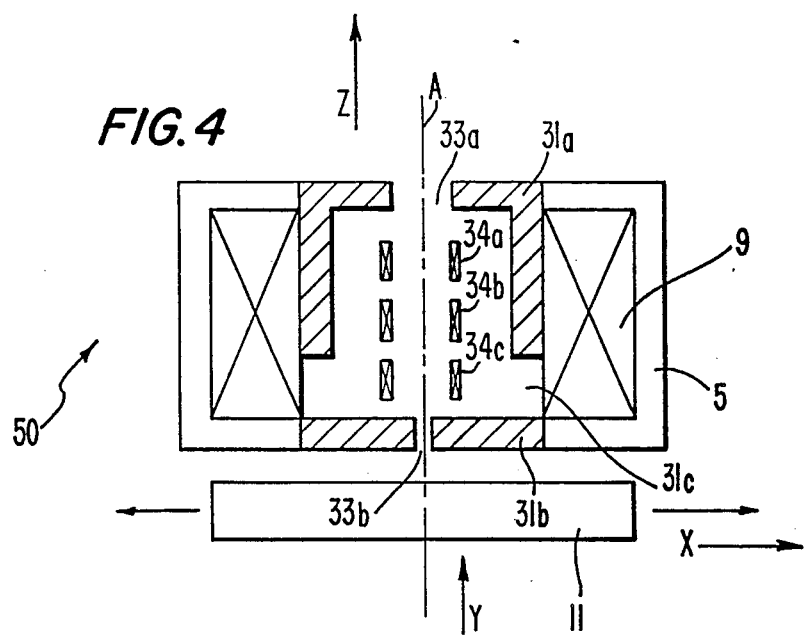
FIG. 4 is a schematic cross-sectional view of a magnetic object lens according to the present invention.
Figure 5:
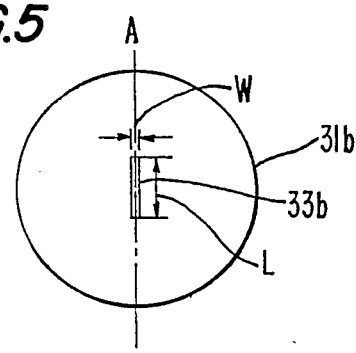
FIG. 5 is a plan view of the lower pole piece 31b of the magnetic object lens of FIG. 4.

FIG. 4 is a schematic cross-sectional view of a magnetic object lens 50 according to the present invention and FIG. 5 is a plan view of a lower pole piece 31b of the magnetic object lens 50 of FIG. 4. Like the prior art magnetic object lens 100 of FIG. 2, the magnetic object lens 50 shown in FIG. 4 has a rotationally symmetrical structure about an axis A which extends in the Z direction, except for a lower pole piece 31b. The magnetic object lens 50 comprises an upper pole piece 31a and the lower pole piece 31b facing the upper pole piece 31a, with the pole pieces 31a and 31b separated by an air space 31c. A coil 9 generates magnetic flux and surrounds the pole pieces 31a, 31b. An outer shield 5 encloses the coil 9, supports the pole pieces 31a and 31b and shields the magnetic flux from leaking outside. Deflection coils 34a and 34b deflect an electron beam B (FIG. 6) in the Y direction twice and a compensation coil 34c shifts the axis of the magnetic object lens. Thus, the lens has three coils for deflection. The coils 34a, 34b, and 34c are arranged inside the pole piece 31a. The lower pole piece 31b faces a stage 11 which is movable in the X and Y directions. The lower pole piece 31b also faces a wafer (not shown) placed on the stage 11 during an electron beam exposure operation for patterning a circuit image on the wafer. The stage 11 is a conventional one, and is made of a ceramic plate, the top surface of which has a plated metal layer as described above. As above, the stage 11 includes a complicated and precise mechanism for moving the stage quickly and accurately, but is represented by a simple plate for convenience.

Although most of the structure of the magnetic object lens shown in FIGS. 4 and 5 is the same as that of the prior art magnetic object lens of FIG. 2, there is a remarkable difference between these magnetic object lenses. That is, the shape of the bore 103b of FIG. 2 or FIG. 3 is circular, allowing the passage of an electron beam B deflected in a predetermined scanning span in any direction, while the shape of the opening (bore 33b) in FIG. 4 and FIG. 5 is an extremely extended rectangle or stripe, having a width W and a length L. The dimensions, location, and direction of the stripe-like opening 33b are determined so that the opening 33b allows the electron beam B to pass therethrough, while the magnetic flux emanating from the magnetic object lens is stopped by the solid portion of the lower pole piece 31b to the extent possible. For example, when the predetermined scanning span of the electron beam B in the Y direction is 2 mm and the sub-area of electron beam exposure is 100 μ square (namely the scanning span of the electron beam B in dimensions, L is within a range from 20 mm to 40 mm and W is within a range from 4 mm to 6 mm. The reason for the relatively large dimensions of W and L is that smaller dimensions will cause mechanical production difficulty in forming the stripe-like opening 33b, since the material of the lower pole piece 31b is ferrite. Ferrite is preferably selected for the lower pole piece 31b since ferrite is a ferromagnetic material and has small magnetic hysteresis.

Figure 6:
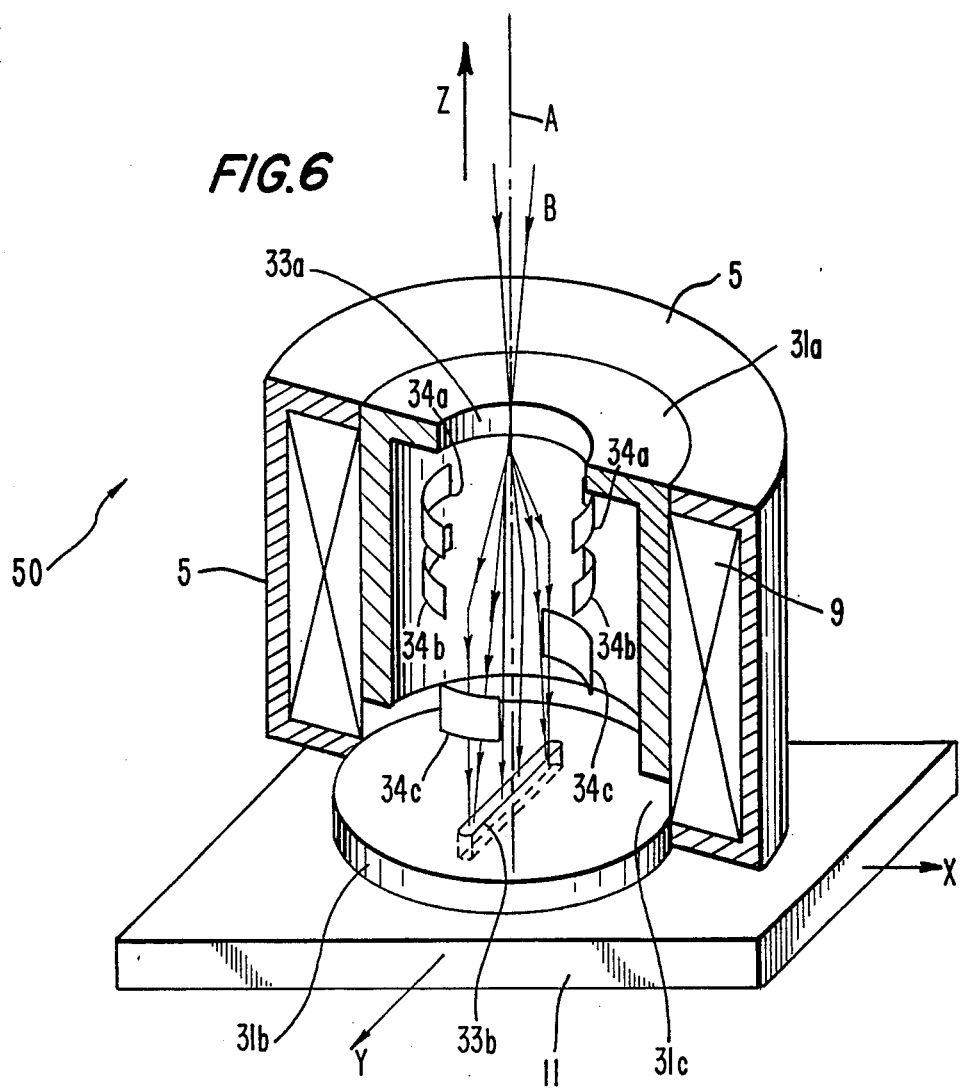
FIG. 6 is a substantially schematic, and partially perspective view of the magnetic object lens of FIG. 4.
Figure 7A:
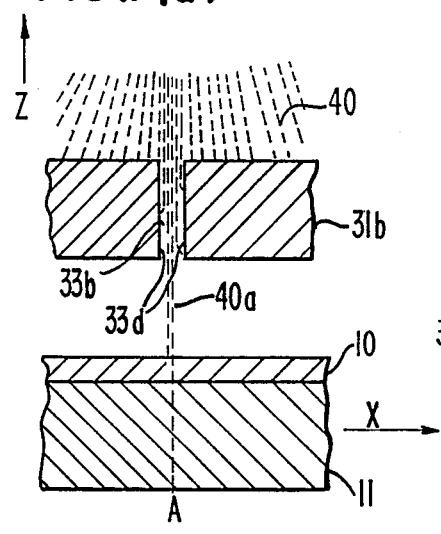
FIGS. 7(a) and 7(b) are magnified partial cross-sectional views of a portion of the magnetic object lines of FIG. 4 in the vicinity of the stripe-like bore 33b of the lower pole piece 31b in the width direction and the longitudinal direction respectively, illustrating the distribution of the magnetic flux of the magnetic object lens.
Figure 7B:
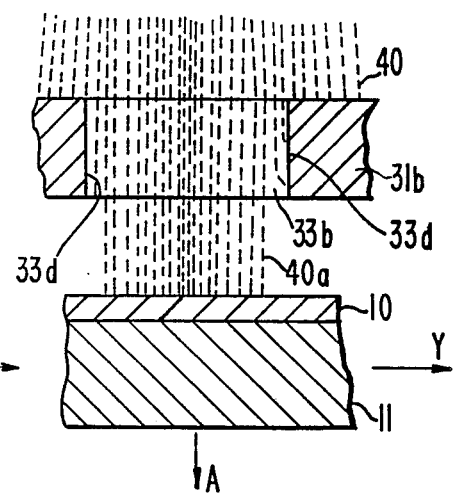

FIG. 6 is a substantially schematic, and partially perspective view of the magnetic object lens 50 of FIG. 4, illustrating the positional relationship between the electron beam B and elements of the magnetic object lens 50. The electron beam B projected from upper portion of FIG. 6 is double-deflected by two pairs of deflection coils 34a and 34b, shifted from the center axis A, and directed in parallel with the axis A, according to a control pattern signal sent from a CPU (not shown). The axis of the magnetic object lens 50 formed by the pole pieces 31a and 31b, and the coil 9, is simultaneously shifted in the same direction and distance by the compensating coil 34c, so that the shifted axis of the magnetic object lens 50 and the shifted electron beam B coincide with each other, resulting in elimination of off-axis aberration of the lens 50. Thus, deflected electron beam B passes through the stripe-like bore 33b and lands normally on a surface of a wafer 10 without axial aberration. Thus, the advantages of the VAL or the VAIL lenses are provided.

As described before, the wafer 10 placed on the stage 11 is always transferred in the X direction continuously at a constant speed. As shown in a magnified partial central cross-sectional view of FIG. (7a) taken in the X direction and FIG. (7b) taken in the Y direction, almost all of the magnetic flux 40 distributed in the space surrounded by the pole pieces 31a and 31b is intersected by the lower pole piece 31b and prevented from reaching the stage 11.

A small amount of magnetic flux 40a is not intersected by the top of the pole piece 31b because of the presence of the stripe-like bore 33b. This magnetic flux 40a, which enters into the space inside the stripe-like opening 33b, is separated into two portions. The first portion of magnetic flux passes through the bore 33b, reaching the wafer 10, and the second magnetic flux portion is deflected and terminated on the side wall 33d of the stripe-like opening 33b of the lower pole piece 31b.

In a plane extending in the X and Z directions, most of the leakage magnetic flux 40 tends to land on the lower pole piece 31b with orbits oblique to the surface of the lower pole piece 31b. A small part of magnetic flux 40a passes a space close to the side wall 33d of the opening 33b of the lower pole piece 31b, and may be terminated at the side wall 33d, as shown in FIG. (7a). The portion of the magnetic flux 40a passing through the center portion of the opening 33b runs in parallel with the axis A. In a plane extending in the Y and Z directions, namely in the longitudinal direction of the stripe-like opening 33b, the leakage magnetic flux 40 runs almost in parallel with the axis A, and almost all of the magnetic flux 40a passing through the stripe-like opening 33b runs in parallel with the axis A, as shown in FIG. (7b). Only a portion of the magnetic flux 40a running through a space very close to both ends of the side wall 33d of the opening 33b is deflected and terminated at the end side wall 33d.

In operation, the electron beam B is scanned within the center plane which contains the axis A and extends in the Y direction (i.e., the longitudinal direction of the opening 33b). The electrons of the beam make a normal landing on the wafer 10. This is a substantial advantage of the present invention.

Figure 8:
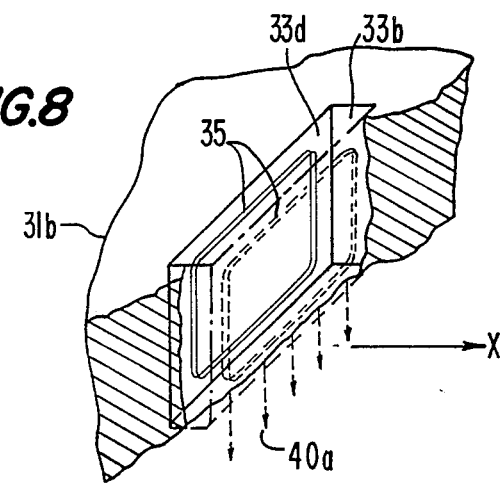
FIG. 8 is an enlarged, partially cut away perspective view of the lower pole piece 31b, illustrating an alternate embodiment of the present invention in which an additional pair of compensating coils 35 are positioned in the opening 33b.

In the above description, a fourth coil equivalent to the lowermost compensating coil of a VAL is not needed. However, by setting a further pair of compensating coils along the side walls 33d of the opening 33b extending in the Y direction, further improved normal landing of the electrons may be achieved in a more stable manner. The magnetic lens field at the lower portion of the magnetic object lens 50 is almost uniform along the Y direction as shown in FIG. (7b) and so a fourth coil for shifting the axis of the object lens for compensation is not needed. In the X direction as shown in FIG. (7a), the lens field is slightly non-uniform, so that the fourth coil for shifting the lens axis in compensation is preferred. FIG. 8 is an enlarged partially broken away perspective view of the lower pole piece 31b for illustrating the use of such compensation coils. In FIG. 8, a pair of deflecting coils 35 are positioned on the side walls 33d of the stripe-like opening 33b to shift the lens axis in compensation. Each of the coils 35 is made of a fine metal wire having several coil turns (e.g., 4 or 5 turns) and a rectangular shape substantially corresponding to the size of the side wall 33d of the stripe-like opening 33b. The coils 35 are attached to the surface of the side walls 33d by an adhesive material. As described above, the deflection coils 35 are employed to deflect the magnetic flux 40a in the X direction only, to provide compensation in the manner described above.

In order to conduct the above-described electron beam exposure, the side walls 33d of the stripe-like bore 31b are to be accurately finished, and particularly to be formed to be perpendicular to the surface of the disk of the lower pole piece 31b, so that the magnetic flux passing through the stripe-like opening 33b is parallel to the axis A.

With the above-described structure of the magnetic object lens according to the present invention, the magnetic flux intersecting with the continuously moving stage 11 is extremely small and no eddy current is induced in the stage 11 except for the eddy current induced by the magnetic flux 40a, the amount of which is negligibly small. Thus, the adverse effect of the eddy current induced in the moving stage 11, namely deflection aberration, seen in prior art magnetic object lens, is eliminated.

In the above description, the electron beam is assumed to be scanned in a single direction, e.g., in the Y direction. However, it is obvious that the scanning direction is not limited to a single direction, but may be composed of two or more directions, for example, in a pattern of a cross. As long as the electron beam is scanned in a limited and narrow space, the present invention may still be applied by forming the bore of the lower pole piece 31b having a shape corresponding to the scanning pattern of the electron beam and as long as the area of the scanning pattern is sufficiently small. In the embodiment, the stage 11 is moved continuously. However, the present invention is also applicable to an electron beam exposure apparatus where the stage is moved intermittently.

It should be noted that the lower pole piece 31b prevents magnetic flux issued from the lower compensating coil 34c located in the vicinity of the stage 11 from inducing an eddy current in the stage 11. Otherwise, undesirable magnetic flux may be generated, which has been a problem of the VAL.

The many features and advantages of the invention are apparent from the detailed specification and thus, it is intended by the appended claims to cover all such features and advantages of the device which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. An electron beam exposure apparatus for projecting an electron beam onto an object which is continuously moving in a moving direction, by scanning the electron beam in a predetermined scanning space extending in a scanning direction, comprising:
a movable stage having a surface for supporting the object, said stage being substantially continuously movable in the moving direction;
a magnetic lens system including:
means for emitting electrons;
means for focusing the electrons into an electron beam, said focusing means having a magnetic object lens comprising:
a coil for generating magnetic flux;
an upper pole piece made of magnetic material and positioned adjacent said coil; and
a lower pole piece made of magnetic material, positioned adjacent said coil and disposed to face the object, said lower pole piece having an opening coincident with the predetermined scanning space of the electron beam, the electron beam passing through said opening, said lower pole piece substantially preventing magnetic flux generated by said lens from reaching said stage; and
means for deflecting the electron beam.

2. An electron beam exposure apparatus as set forth in claim 1, wherein said magnetic material of said lower pole piece is ferrite.

3. An electron beam exposure apparatus as set forth in claim 1, wherein said surface supports a semiconductor wafer.

4. An electron beam exposure apparatus as set forth in claim 1, wherein the scanning direction of the electron beam is substantially perpendicular to the moving direction of said stage.

5. An electron beam exposure apparatus as set forth in claim 1, wherein the shape of said opening in said lower pole piece is a stripe longitudinally extending in the scanning direction of the electron beam, having a length substantially longer than the width of the stripe.

6. An electron beam exposure apparatus as set forth in claim 5, wherein a side wall of said opening is formed to be substantially perpendicular to the surface of said lower pole piece.

7. An electron beam exposure apparatus as set forth in claim 5, further comprising coils positioned on opposite sides of said opening.

8. An electron beam exposure apparatus for scanning an electron beam in a predetermined scanning space extending in a scanning direction and irradiating an object mounted on a stage which is substantially continuously moving in a predetermined moving direction, comprising a magnetic object lens for focusing the electron beam, said magnetic object lens comprising a lower pole piece of magnetic material facing the object, said lower pole piece having an opening having a shape corresponding to the predetermined scanning space of the electron beam, the electron beam passing through the limited opening.

9. An electron beam exposure apparatus for projecting an electron beam onto an object, comprising:
a movable stage having a surface for supporting the object, said stage being movable in a moving direction;
means for forming an electron beam and for scanning the electron beam in a predetermined scanning pattern; and
a magnetic object lens for focusing the electron beam, said magnetic object lens being positioned in the path of the electron beam and opposite said stage, said magnetic object lens including a pole piece disposed to face said stage, said pole piece having an opening with shape corresponding to the predetermined scanning pattern of the electron beam, the electron beam passing through said opening, said pole piece substantially preventing magnetic flux generated by said magnetic object lens from reaching said stage.

10. An electron beam exposure apparatus according to claim 9, wherein said opening of said pole piece is rectangular.

11. An electron beam exposure apparatus according to claim 10, wherein the rectangular opening has a length within a range from 20 mm to 40 mm and a width within a range from 4 mm to 6 mm.

12. An electron beam exposure apparatus according to claim 10, wherein said pole piece is formed of magnetic material.

13. An electron beam exposure apparatus according to claim 12, wherein the scanning direction of the electron beam is substantially perpendicular to the moving direction of said stage.

14. An electron beam exposure apparatus according to claim 13, wherein said opening has a side wall which is formed to be substantially perpendicular to the surface of said pole piece.

15. An electron beam exposure apparatus according to claim 10, wherein said opening has a side wall which is formed to be substantially perpendicular to the surface of said pole piece, said electron beam exposure apparatus further comprising first and second coils coupled to the side walls of said opening along the length of said side walls, so that said first and second coils oppose each other inside said rectangular opening.

16. An electron beam exposure apparatus according to claim 9, wherein said opening of said pole piece has a length of a first dimension and a width of a second dimension which is less than the first dimension.

17. A magnetic object lens for an electron beam exposure apparatus which projects an electron beam onto an object supported by a stage movable in a moving direction, the electron beam having a predetermined scanning pattern, comprising:
- a coil for generating magnetic flux;
- a first pole piece positioned adjacent said coil; and
- a second pole piece positioned adjacent said coil and disposed to face the object, said second pole piece having an opening with a shape corresponding to the predetermined scanning pattern of the electron beam, the electron beam passing through said opening, said second pole piece substantially preventing magnetic flux generated by said coil from reaching the stage.

18. A magnetic object lens according to claim 17, wherein said opening is rectangular.

19. A magnetic object lens according to claim 18, wherein said rectangular opening has a length within a range of 20 mm to 40 mm and a width within a range from 4 mm to 6 mm.

20. A magnetic object lens according to claim 17, wherein said first and second pole pieces are made of magnetic material.

21. A magnetic object lens according to claim 20, wherein said first and second pole pieces are made of ferrite.

22. A magnetic object lens according to claim 18, wherein said opening has side walls which are formed to be substantially perpendicular to the surface of said second pole piece, said magnetic object lens further comprising first and second coils coupled to the side walls of said opening along the length of said side walls, so that said first and second coils oppose each other inside said rectangular opening.

23. A magnetic object lens according to claim 17, wherein said opening has a length of a first dimension and a width of a second dimension which is less than a first dimension.

* * * * *

UNITED STATES PATENT AND TRADEMARK OFFICE
CERTIFICATE OF CORRECTION

PATENT NO. : 4,929,838
DATED : MAY 29, 1990
INVENTOR(S) : HIROSHI YASUDA ET AL.

It is certified that error appears in the above-identified patent and that said Letters Patent is hereby corrected as shown below:

Col. 4, line 4, "0 12 15 345750 5," should be
--0 12 345750 5,--;
line 5, "7214 81." should be --72-81.--;
line 6, "With" should be --with--.

Col. 6, line 56, "(FIG." should be --(FIG. 1).--.

Col. 9, line 9, "in dimensions," should be --in the X direction is 100 $\mu$) then for the above-described dimensions,--.

Col. 10, line 4, "40arun-" should be --40a run- --.

Signed and Sealed this

Sixteenth Day of July, 1991

Attest:

HARRY F. MANBECK, JR.

Attesting Officer

Commissioner of Patents and Trademarks